(12) United States Patent
Liu et al.

(10) Patent No.: US 7,736,914 B2
(45) Date of Patent: Jun. 15, 2010

(54) PLASMA CONTROL USING DUAL CATHODE FREQUENCY MIXING AND CONTROLLING THE LEVEL OF POLYMER FORMATION

(75) Inventors: Jingbao Liu, Sunnyvale, CA (US); Taeho Shin, San Jose, CA (US); Bryan Y. Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 11/947,663

(22) Filed: Nov. 29, 2007

(65) Prior Publication Data

US 2009/0142859 A1 Jun. 4, 2009

(51) Int. Cl.
*H01L 21/00* (2006.01)
*H01L 21/66* (2006.01)
*H01L 21/20* (2006.01)

(52) U.S. Cl. .............................. 438/8; 438/14; 438/394

(58) Field of Classification Search .................... 438/8, 438/14, 394; 257/E21.218, E21.521, E21.001
See application file for complete search history.

(56) References Cited

U.S. PATENT DOCUMENTS

| | | | |
|---|---|---|---|
| 4,579,618 | A | 4/1986 | Celestino et al. |
| 4,585,516 | A | 4/1986 | Corn et al. |
| 4,863,549 | A | 9/1989 | Grunwald |
| 5,065,118 | A | 11/1991 | Collins et al. |
| 5,077,499 | A | 12/1991 | Oku |
| 5,512,130 | A | 4/1996 | Barna et al. |
| 5,534,751 | A | 7/1996 | Lenz et al. |
| 5,556,501 | A | 9/1996 | Collins et al. |
| 5,570,031 | A | 10/1996 | Sasaki et al. |
| 5,643,364 | A | 7/1997 | Zhao et al. |
| 5,698,062 | A | 12/1997 | Sakamoto et al. |
| 5,817,534 | A | 10/1998 | Ye et al. |

(Continued)

FOREIGN PATENT DOCUMENTS

EP 0553704 8/1993

(Continued)

OTHER PUBLICATIONS

Georgieva, V., et al., "Numerical study of $Ar/CF_4/N_2$ discharges in single- and dual-frequency capacitively coupled plasma reactors", *Journal of Applied Physics*, vol. 94, No. 6 (Sep. 15, 2003), 3748-3756.

(Continued)

*Primary Examiner*—William M Brewster
(74) *Attorney, Agent, or Firm*—Moser IP Law Group

(57) ABSTRACT

Methods for processing a substrate in a processing chamber using dual RF frequencies are provided herein. In some embodiments, a method of processing a substrate includes forming a plasma of a polymer forming chemistry to etch a feature into a substrate disposed on a substrate support in a process chamber while depositing a polymer on at least portions of the feature being etched. A low frequency and a high frequency RF signal are applied to an electrode disposed in the substrate support. The method further includes controlling the level of polymer formation on the substrate, wherein controlling the level of polymer formation comprises adjusting a power ratio of the high frequency to the low frequency RF signal.

20 Claims, 6 Drawing Sheets

U.S. PATENT DOCUMENTS

| | | | |
|---|---|---|---|
| 5,985,375 | A | 11/1999 | Donohoe et al. |
| 6,089,181 | A | 7/2000 | Suemasa et al. |
| 6,110,287 | A | 8/2000 | Arai et al. |
| 6,113,731 | A | 9/2000 | Shan et al. |
| 6,126,778 | A | 10/2000 | Donohoe et al. |
| 6,190,496 | B1 | 2/2001 | DeOrnellas et al. |
| 6,193,855 | B1 | 2/2001 | Gopalraja et al. |
| 6,218,309 | B1 * | 4/2001 | Miller et al. ................ 438/700 |
| 6,309,978 | B1 | 10/2001 | Donohoe et al. |
| 6,312,556 | B1 | 11/2001 | Donohoe et al. |
| 6,350,701 | B1 | 2/2002 | Yamazaki |
| 6,354,240 | B1 | 3/2002 | DeOrnellas et al. |
| 6,411,490 | B2 | 6/2002 | Dible |
| 6,433,297 | B1 | 8/2002 | Kojima et al. |
| 6,642,149 | B2 | 11/2003 | Suemasa et al. |
| 6,706,138 | B2 | 3/2004 | Barnes et al. |
| 6,872,281 | B1 | 3/2005 | Chen et al. |
| 2002/0039626 | A1 | 4/2002 | Nakahigashi et al. |
| 2002/0041160 | A1 | 4/2002 | Barnes et al. |
| 2003/0127319 | A1 | 7/2003 | Demaray et al. |
| 2003/0148611 | A1 | 8/2003 | Dhindsa et al. |
| 2004/0025791 | A1 | 2/2004 | Chen et al. |
| 2004/0045669 | A1 | 3/2004 | Okumura et al. |
| 2004/0221958 | A1 | 11/2004 | Loewenhardt et al. |
| 2004/0255863 | A1 | 12/2004 | Higashiura et al. |
| 2005/0022933 | A1 | 2/2005 | Howard |
| 2005/0241762 | A1 | 11/2005 | Paterson et al. |
| 2008/0029385 | A1 * | 2/2008 | Koshimizu et al. .......... 204/164 |

FOREIGN PATENT DOCUMENTS

| | | |
|---|---|---|
| JP | 08-306659 A | 11/1996 |
| JP | 2002-246368 | 8/2002 |
| JP | 2003-073836 | 3/2003 |
| WO | WO-03/003405 A1 | 1/2003 |
| WO | WO-03/043061 A1 | 5/2003 |

OTHER PUBLICATIONS

Lieberman, M. A., et al., "Standing wave and skin effects in large-area, high-frequency capacitive discharges", *Plasma Sources Sci. Technol.*, 11 (2002), 283-293.

International Search Report and Written Opinion mailed Feb. 25, 2009 for PCT Application No. PCT/US2008/084635.

* cited by examiner

PLASMA CONTROL USING DUAL CATHODE FREQUENCY MIXING AND CONTROLLING THE LEVEL OF POLYMER FORMATION

BACKGROUND

1. Field

Embodiments of the present invention generally relate to plasma control in a semiconductor substrate processing system and, more particularly, to plasma control using dual cathode frequency mixing techniques.

2. Description of the Related Art

The increase in size of plasma enhanced semiconductor processing chambers contributes to a spatially variant effect over the surface of the substrate being processed. That is, as the size of the substrate being processed approaches the wavelength of the frequency that is used to bias the substrate, a spatial variation in the RF power distribution forms over the surface of the substrate (e.g., proximate the cathode that forms an electrode). This spatial variation can be frequency dependent in the regime of higher frequencies (shorter wavelengths), larger substrates, or combinations of the two. This spatially variant effect has a negative impact on process uniformity. For example, in an etch reactor, the standing wave effect can cause non-uniformity in the etched substrate surface.

Therefore, there is a need for an improved method and apparatus for semiconductor substrate processing that combats this spatially variant effect.

SUMMARY

Methods for processing a substrate in a processing chamber using dual RF frequencies are provided herein. In some embodiments, a method of processing a substrate includes forming a plasma of a polymer forming chemistry to etch a feature into a substrate disposed on a substrate support in a process chamber while depositing a polymer on at least portions of the feature being etched. A low frequency and a high frequency RF signal are applied to an electrode disposed in the substrate support. The method further includes controlling the level of polymer formation on the substrate, wherein controlling the level of polymer formation comprises adjusting a power ratio of the high frequency to the low frequency RF signal.

In some embodiments, a method of processing a substrate includes forming a plasma in a process chamber by coupling RF power at a first frequency to a polymer forming process gas disposed in the process chamber; applying RF power to an electrode disposed in the process chamber at a second frequency and a third frequency; and controlling a level of polymer formation on a substrate being etched in the process chamber. Controlling the level of polymer formation may include adjusting a power ratio of the second frequency to the third frequency.

BRIEF DESCRIPTION OF THE DRAWINGS

So that the manner in which features, advantages and objects of embodiments of the present invention may be attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Embodiments of the present invention generally relate to semiconductor substrate processing in plasma enhanced processing chambers. More specifically, embodiments of the present invention pertain to a method and apparatus for controlling the characteristics of a plasma formed in a plasma enhanced processing chamber. Characteristics of the plasma which may be controlled include, but are not limited to, the power distribution within the plasma, and the ion energy distribution within the plasma and incident on the workpiece. These plasma characteristics may be controlled via a dual frequency cathode with ratio control in a plasma enhanced processing chamber.

Examples of plasma enhanced semiconductor processing chambers that may be adapted to benefit from the present invention include the eMax™, MXP®, and ENABLER™ processing chambers, all available from Applied Materials, Inc. of Santa Clara, Calif. The eMax™ processing chamber is described in U.S. Pat. No. 6,113,731, issued Sep. 5, 2000 to Shan et al. The MXP® processing chamber is described in U.S. Pat. No. 5,534,108, issued Jul. 9, 1696 to Qian et al., and U.S. Pat. No. 5,674,321, issued Oct. 7, 1997 to Pu et al. The ENABLER™ processing chamber is described in U.S. patent application Ser. No. 10/192,271, filed on Jul. 9, 2002. Each of these above-mentioned patents are hereby incorporated by reference in their entireties.

Figure 1:
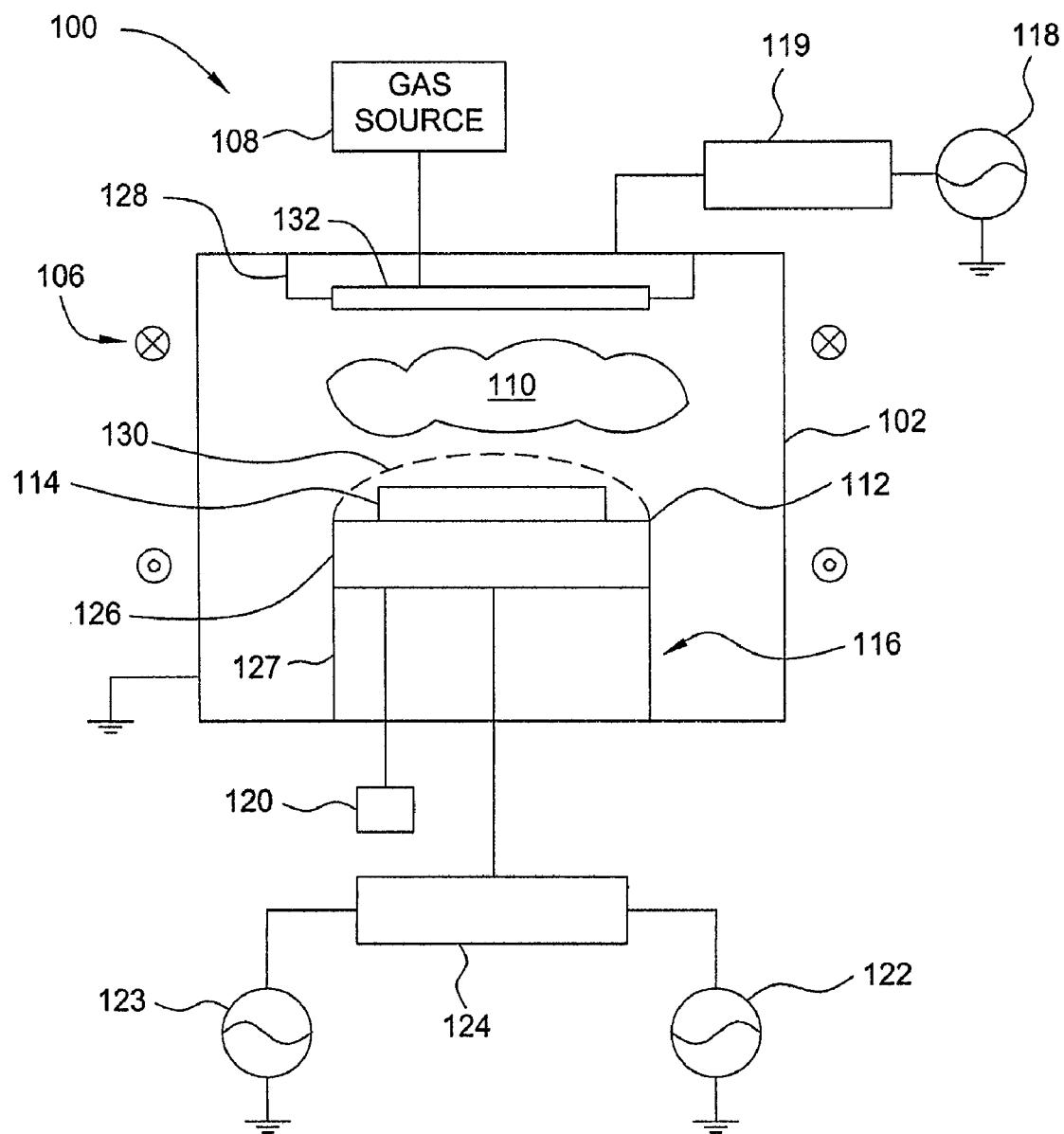
FIG. 1 is a partial schematic, cross-sectional view of a plasma enhanced processing chamber useful for practicing embodiments of the present invention.

FIG. 1 depicts a partial schematic, cross-section view of a plasma enhanced processing chamber 100 useful for practicing certain embodiments of the present invention. In one embodiment, a process chamber 100 includes a grounded chamber body 102 and at least one coil segment 106 disposed proximate to the exterior of the chamber body 102. The process chamber 100 also includes a substrate support pedestal 116 disposed within the chamber body 102 and spaced apart from a gas inlet 132. The substrate support pedestal 116 comprises a cathode 127 and an electrostatic chuck 126 for retaining a substrate 114 beneath the gas inlet 132.

The electrostatic chuck 126 is driven by a DC power supply 120 to develop an electrostatic force that holds the substrate on the chuck surface. The cathode 127 is coupled to a pair of RF bias sources 122, 123 through a matching network 124. The bias sources 122, 123 are generally capable of producing an RF signal having a frequency of from about 50 kHz to about 100 MHz and a power of between about 0 and about 10,000 Watts. The matching network 124 matches the impedance of the sources 122, 123 to the plasma impedance. A single feed couples energy from both sources 122, 123 to the support pedestal 116. Alternatively, each source 122, 123 can be coupled to the cathode 127 via a separate feed.

The gas inlet 132 may comprise one or more nozzles or a showerhead. The gas inlet 132 may comprise a plurality of gas distribution zones such that various gases provided from a gas source 108—which, when ignited, form a plasma 110 can be supplied to the chamber body 102 using a specific gas distribution gradient. The gas inlet 132 may form an upper electrode 128 that opposes the support pedestal 116. The upper electrode 128 can be coupled to an RF source 118 through a matching network 119, terminated to a specific impedance, or grounded. The source 118 is generally capable of producing an RF signal having a frequency in the about 10 Mhz to about 3 GHz range and a power between about 0 and 10,000 Watts. In one embodiment, the source 118 is capable of producing an RF signal having a frequency of about 60 MHz. The RF energy supplied by the source is generally used to facilitate dissociation and ionization of gases in the plasma.

In operation, a substrate 114 is disposed in the processing chamber 100 and held to the support pedestal 116 by the electrostatic chuck 126. A process gas is introduced into the chamber body 102 through the gas inlet 132 by the gas source 108. A vacuum pump, not shown, maintains the pressure inside the chamber body 102 at operating pressures—typically between about 10 mTorr to about 20 Torr.

In one embodiment, the RF source 118 provides about 1000 Watts of RF voltage at 13.56 MHz to the upper electrode 128, thereby exciting the gas inside the chamber body 102 and forming a plasma 110. The RF source 122 is selected to generate power at a frequency of about 2 MHz and the RF source 123 is selected to generate power at a frequency of about 13.56 MHz. The RF sources 122, 123 provide up to about 10,000 Watts of total RF power in a predetermined power ratio from the source 122 to the source 123 of between 1:0 and 0:1. These RF sources 122, 123 provide bias power that both self-biases the substrate and modulates the plasma sheath. Adjusting the ratio between the source 122 and 123 controls the characteristics of the plasma as defined below. The plasma, having a characteristic defined by the power ratio of the bias sources, facilitates etching one or more materials on the surface of the substrate. After a period of time, or the detection of a specific endpoint, the plasma is extinguished.

I. Control of Ion Energy Distribution Within the Plasma

Figure 2:
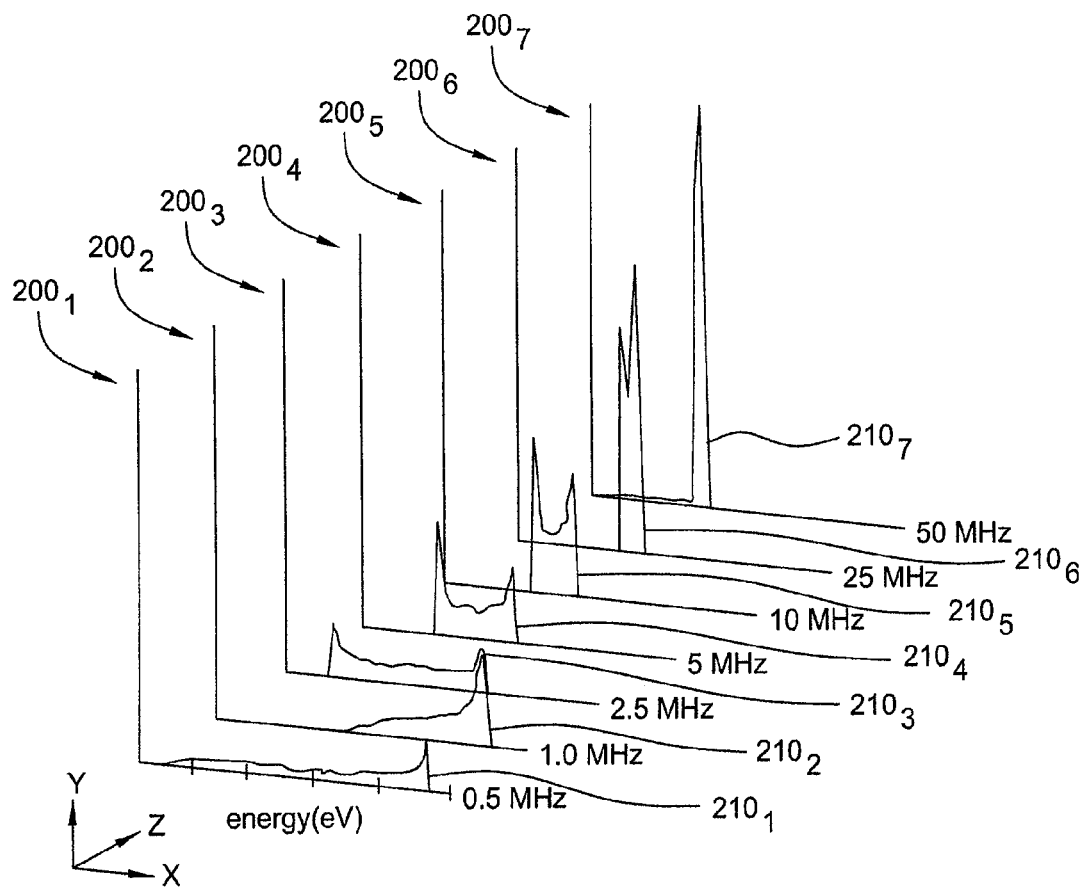
FIG. 2 is a graph of known ion energy distributions as a function of drive frequency.

The frequency dependence of ion energy distribution within a plasma chamber is well known. FIG. 2, taken from IEEE Trans. Plasma Sci., Vol. 19, No. 2, page 242, depicts a series of graphs $200_{1-7}$ of histograms (along the Y axes) of known ion energy distributions (along the X axes) as a function of drive frequencies (along the Z axis). As can be seen in the graphs $200_{1-7}$, the ion energy distribution associated with lower frequencies has a broader energy bandwidth (e.g., distribution $210_1$ in graph $200_1$), while higher frequencies have a progressively much more concentrated energy bandwidth (e.g., distribution $210_7$ in graph $200_7$). The relationship is generally continuous along the spectrum moving from the low frequency ion energy distribution to the high frequency ion energy distribution (e.g., compare distributions $210_{1-7}$ from graphs $200_{1-7}$).

Referring back to FIG. 1, in one embodiment, the process chamber comprises a dual frequency electrode (cathode 127) for use in a plasma enhanced processing chamber 100 as described above. The two frequencies on the cathode 127 are generally selected for the purpose of sheath modulation and are selected such that they are of a low enough frequency so as to provide a strong self-biasing sheath in the plasma discharge above the powered surface.

The first frequency provides a broad ion energy distribution (e.g., lower frequency). The second frequency provides a peaked, well defined ion energy distribution (e.g., higher frequency). Typically, the first frequency is selected such that its cycle time is much larger than the transit time of an ion in the sheath, while the second frequency is selected such that its period approaches or surpasses the transit time of the ion in the sheath. These frequencies are also selected such that when used in conjunction with a third power source provided by an independently driven electrode (e.g., the electrode 128 referred to in FIG. 1), they are not the primary power contributor for plasma ionization and dissociation.

The combined applied voltage of the two frequency sources is used to control the peak-to-peak sheath voltage as well as the self-biased DC potential that is used for anisotropic etching. The mixing of the two frequencies is used to tune the energy distribution about this average acceleration generated by this DC potential. Thus, utilizing a plasma enhanced processing chamber with a dual frequency cathode as described above, the ion energy distribution within the plasma can be controlled.

To understand how this ion energy distribution tuning works, consider a simple sheath model based on the RF current driven through a cylindrical plasma discharge. The thickness of the plasma sheath generated will oscillate linearly with the applied current:

$$s(t) = \bar{s} - s_0 \sin(\omega t) \qquad (1)$$

where s is the thickness of the sheath, $\bar{s}$ is the average thickness over time, and $s_0$ is the amplitude of modulation generated by the RF power delivery at frequency $\omega/2\pi$.

If multiple frequencies are applied, the effect on the sheath thickness is additive, yielding:

$$s(t) = \bar{s} - s_{0_{xMHz}} \sin(\omega_x t) - s_{0_{yMHz}} \sin(\omega_y t) \qquad (2)$$

where the subscripts x and y refer to the first and second RF sources respectively.

Assuming a symmetric discharge (just for simplicity of discussion; a similar case will hold true for asymmetric discharges as well), the sheath modulation can be related to applied RF current by the relationship:

$$\bar{s} = s_{0_{xMHz}} + s_{0_{yMHz}} \qquad (3)$$

$$s_{0_{xMHz}} = \frac{I_{xMHz}}{en\omega_x A} \qquad (4)$$

$$s_{0_{yMHz}} = \frac{I_{yMHz}}{en\omega_y A} \qquad (5)$$

where I is the current amplitude at the stated frequency; e is the electron charge; n is the electron density of the bulk plasma; and A is the area of the powered surface (electrode).

The voltage across the sheath is related to this sheath modulation by the equation:

$$V_{sheath}(t) = -\frac{en}{2\varepsilon_0}s(t)^2 \quad (6)$$

where $\varepsilon_0$ is the permittivity of free space.

The acceleration of the ions and electrons can then be solved using a system of differential equations based on charged particle motion in an electromagnetic field:

$$\text{ions}: \frac{d^2x}{dt^2} = \frac{e}{M_{ion}(s_{xMHz} + s_{yMHz})^2}V(t)x = 0 \quad (7)$$

$$\text{electrons} := \frac{d^2x}{dt^2} = \frac{-e}{m_e(s_{xMHz} + s_{yMHz})^2}V(t)x = 0 \quad (8)$$

where $M_{ion}$ and $m_e$ are the masses of an ion and an electron, respectively, and with boundary conditions stating that the net charge on the electrode surface over an RF cycle is zero and that the initial velocity of the ion before it enters the sheath is equal to the Bohm velocity of the ion. Solving for this system of equations for ion velocity at the electrode surface provides a measure of ion energy distribution.

In order to physically assess the ability to control the ion energy distribution of the plasma in operation, the expected ion energy distribution in a plasma formed under a range of operating conditions was modeled and experimentally verified. The ion energy distribution was estimated by studying the on-substrate voltage on a substrate under various process conditions in an eMax™ processing chamber outfitted with a dual frequency cathode as described above with reference to FIG. 1. During this analysis, the two fundamental components of the plasma relative to its interaction with the powered electrode (sheath peak-to-peak voltage and bulk electron density) were held constant and the ratios of applied currents (i.e., proportional to the applied power) of the two RF bias sources were varied while feeding a constant total power to the cathode. The first RF source 122 was tuned to 13.56 MHz and the second RF source 123 was tuned to 2 MHz.

Figure 3:
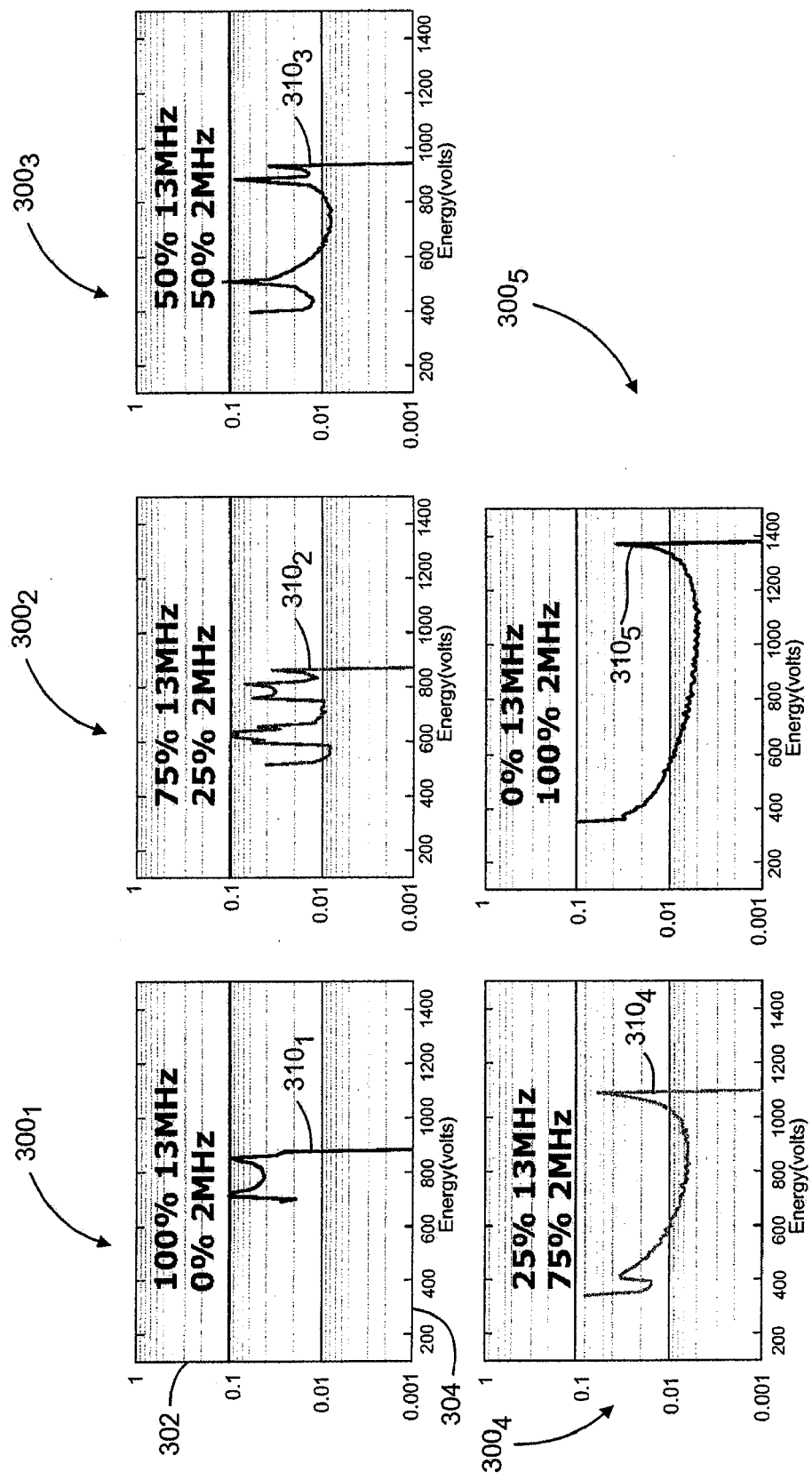
FIG. 3 is a series of graphs depicting ion energy distribution at various RF current ratios.

FIG. 3 is a series of graphs $300_{1-5}$ of this analysis, illustrating the results of varying the ratio of the applied currents of the two RF sources. The graphs show a distribution (axis 302) of the energy (axis 304) measured on the substrate. As can be seen from the graph $300_5$, labeled 0% 13 MHz, 100% 2 MHz, if the cathode is only driven with the low frequency RF source, an ion energy distribution $310_5$ which is very broad is obtained. This result is similar to the low frequency ion energy distributions depicted in FIG. 2 (see, e.g., distribution $210_1$ in graph $200_1$). The graph $300_1$, labeled 100% 13 MHz, 0% 2 MHz, on the other hand, shows a narrow energy distribution $310_1$ similar to the high frequency ion energy distributions depicted in FIG. 2 (see, e.g., distributions $210_5$ and $210_6$ in graphs $200_{5-6}$) when only the high frequency RF source is used.

However, the remaining graphs depicting other ratios where both the high and the low RF frequencies were mixed together reveal an important result. These graphs show the exact same trend as if individual intermediate frequencies were selected, as can be seen by comparison of the graphs $300_{1-5}$ to the histograms depicted in the graphs $200_{1-7}$ of FIG. 2. This shows how a desired distribution along a continuum of individual low to high frequency RF sources may be obtained by utilizing only two sources, rather than many sources. This result increases the capability to perform more processes in one chamber, i.e., increases the "process window" of the chamber.

Although the foregoing discussion focused only on modulating sheath properties with the dual frequency cathode drive, the principles discussed herein could be applied for dissociation as well. This would eliminate the need for the upper RF source for dissociation (RF source 118 in FIG. 1).

Furthermore, the chosen frequencies of 2 MHz and 13.56 MHz are illustrative only and not intended to define limitations of the invention. Both higher and lower frequencies can be utilized in the current invention.

II. Control of Power Distribution Within the Plasma

In another embodiment, the power distribution within the plasma can be controlled utilizing a plasma enhanced processing chamber with a dual frequency cathode as described above with reference to FIG. 1. In this embodiment, two frequencies that provide similar plasma excitation properties but with different spatial uniformity profiles are combined to tune the uniformity of a process. For example, in the process chamber 100 depicted in FIG. 1, the cathode 127 forms a radial transmission line which is terminated along an outer perimeter 112 of the electrostatic chuck 126. This contributes to the creation of a spatially variant power distribution, illustratively shown as a dashed line 130 (it should be noted that the standing wave could be the inverse of the one shown as well). The spatially variant power distribution affects the power distribution in the plasma 110, resulting in greater power near the peak of the wave (near the center of the substrate 114 for the wave 130 depicted in FIG. 1) and lesser power in the trough (near the edge of the substrate 114 in FIG. 1). This power differential in the plasma affects the uniformity of the process being performed on the substrate. As such, in an etch reaction, the uniformity of an etched substrate would be negatively impacted.

Figure 4:
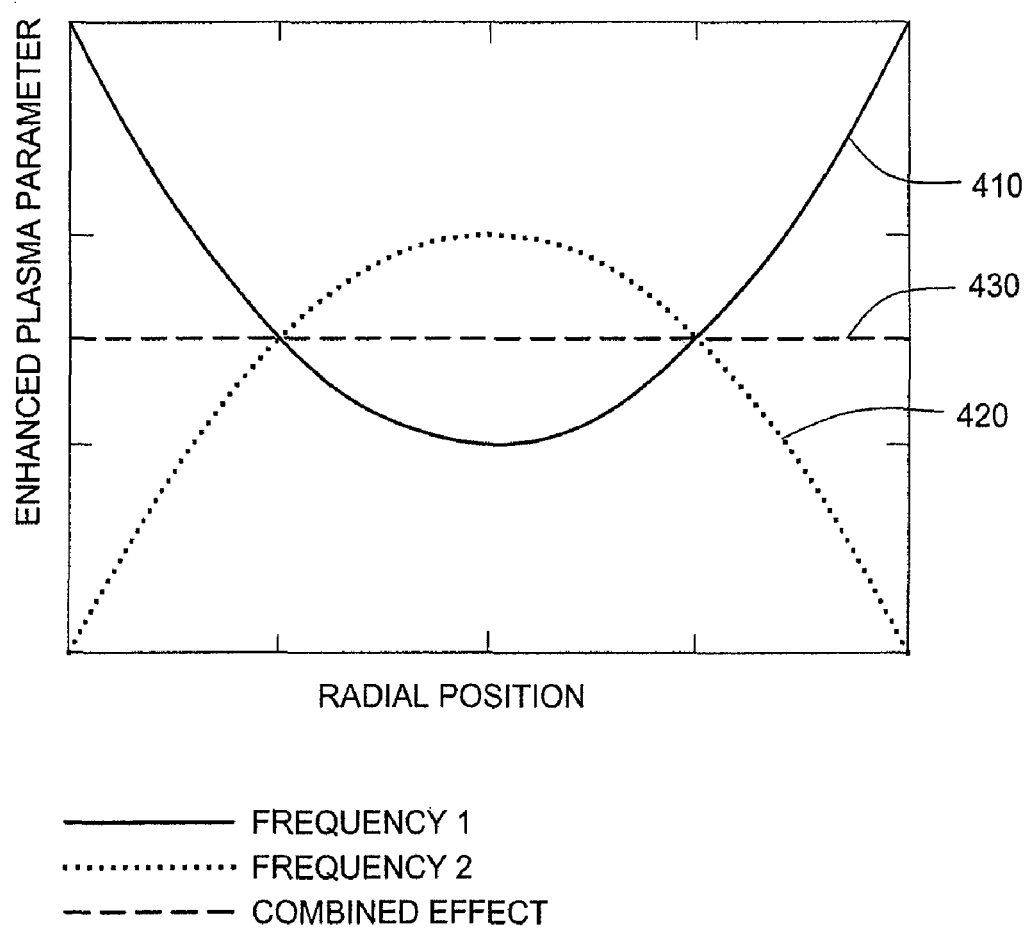
FIG. 4 is an illustrative schematic graph depicting the effect of multi-frequency mixing.

However, since the spatially variant power effect described above varies at different frequencies, two RF sources with different frequencies may be mixed together to drive the cathode 127 such that their respective standing waves substantially cancel each other. This is illustratively depicted in FIG. 4, which shows two opposing power distribution profiles 410, 420 centered over a substrate yielding a flat combined effect 430. It should also be noted that any other final power distribution profile that may prove beneficial to a certain process can also be formed using this method. (For example, in some CVD processes, an edge high power deposition profile is preferred to minimize the impact of non-azimuthally symmetric deposition in high-aspect ratio features on a processed workpiece).

This frequency mixing phenomenon may be used to control the power distribution in the plasma and thereby control uniformity of a desired process, such as etching. For example, to measure the effect of dual frequency tuning on process uniformity, an oxide layer and a photoresist layer on multiple substrates were etched using different cathode frequency ratios in an eMax™ processing chamber outfitted with a dual frequency cathode as described above with reference to FIG. 1. The first RF source was tuned to 13.56 MHz and the second RF source was tuned to 2 MHz. In each of these etch processes, the ratios of applied currents of the two RF drives were varied while keeping the total power to the cathode constant at 2,500 Watts. The oxide and photoresist etch rates were measured as well as the uniformity of each layer.

Figure 5:
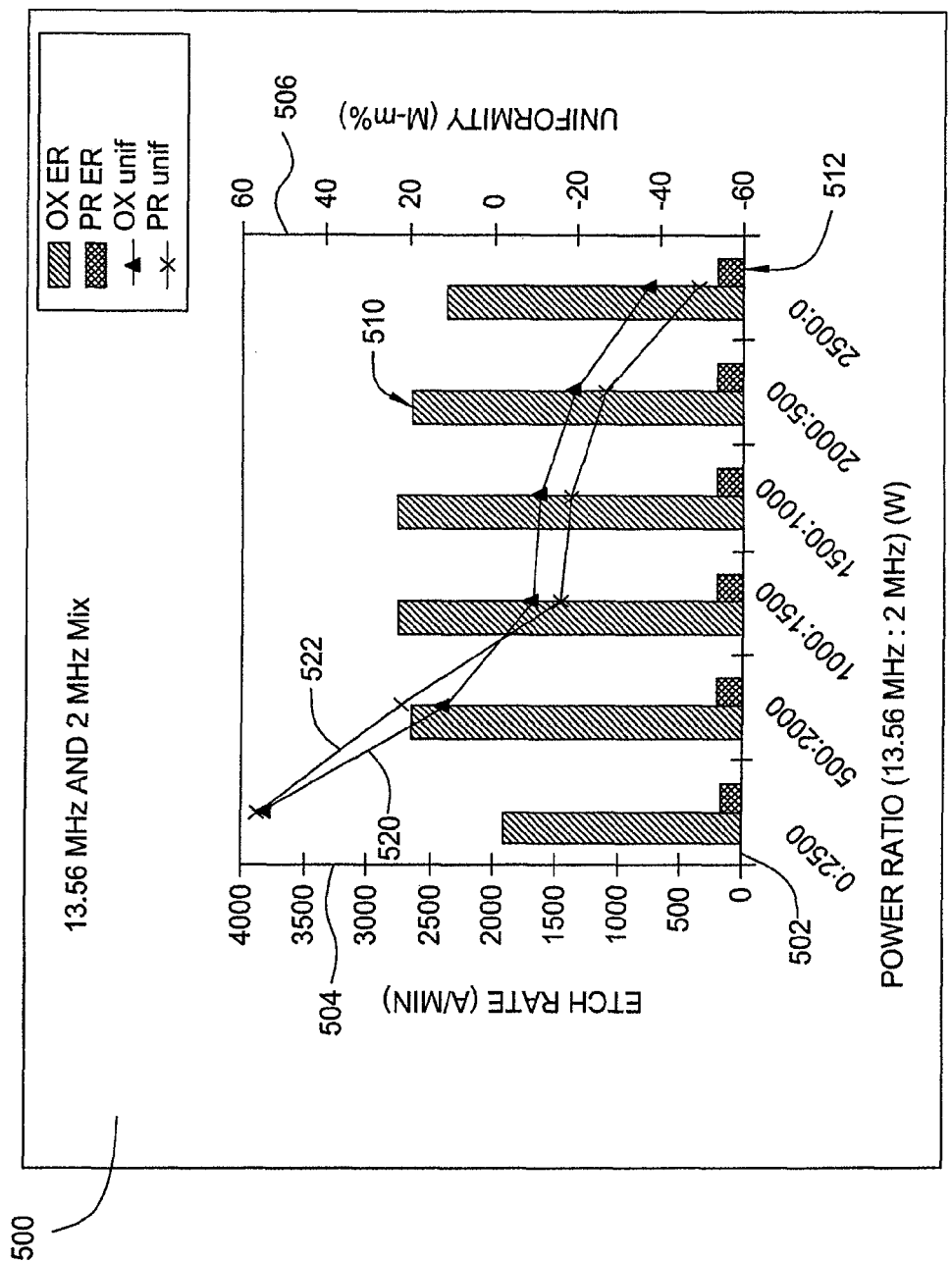
FIG. 5 is a graph depicting improvement in uniformity realized using the frequency mixing principles of the embodiments of the present invention.

FIG. 5 depicts a combined bar graph and line graph 500 depicting the etch rates and substrate uniformity for the processes described above. The x-axis 502 of the graph depicts the ratio of the power supplied by the 13.56 Mhz source to the power supplied by the 2 Mhz source. (For example 0:2500 means 0 W of the 13.56 MHz source and 2,500 W of the 2 MHz source.) As can be seen from the bars 510 labeled OX ER (oxide etch rate) and the bars 512 labeled PR ER (photoresist etch rate), the etch rate (axis 504) remains relatively constant regardless of the mix of power levels at the different frequencies.

However, the substrate uniformity (axis 506) for both the oxide and the photoresist (respectively shown as line 520, labeled "OX unif," and line 522, labeled PR unif," in FIG. 5) varied substantially over the power ratio mix. The uniformity ranged somewhat linearly from about 60% (indicating center-fast etching) at 0 W 13.56 MHz and 2500 W 2 MHz, to about −50% (indicating edge-fast etching) at 2500 W 13.56 MHz and 0 W 2 MHz, and near 0% with a fairly even ratio of the power of two frequencies. These results show that uniformity on an etched surface can be controlled fairly independently of the etch rate by controlling the power ratio of each frequency applied to a dual frequency cathode.

As mentioned above, the principles discussed herein apply to dissociation or ionization of bulk plasma, as well as modulation of the sheath properties of the plasma. Also, the chosen frequencies of 2 MHz and 13.56 MHz are illustrative only and not intended to define limitations of the invention. Both higher and lower frequencies may be utilized in the current invention. For example, drive frequencies may be grouped by their effect on the plasma, then selected as necessary to control the desired property. For example, high frequencies effect ionization and dissociation, while lower frequencies effect sheath modulation. Furthermore, the principles disclosed herein are not limited to control of standing waves. Additional reasons for frequency dependent propagation exist. For example, providing a frequency dependent termination to the transmission line, or a frequency dependent return path to ground in the chamber that can direct the RF waveform dependent upon its frequency.

III. Dual Frequency Bias Process Control

Figure 6:
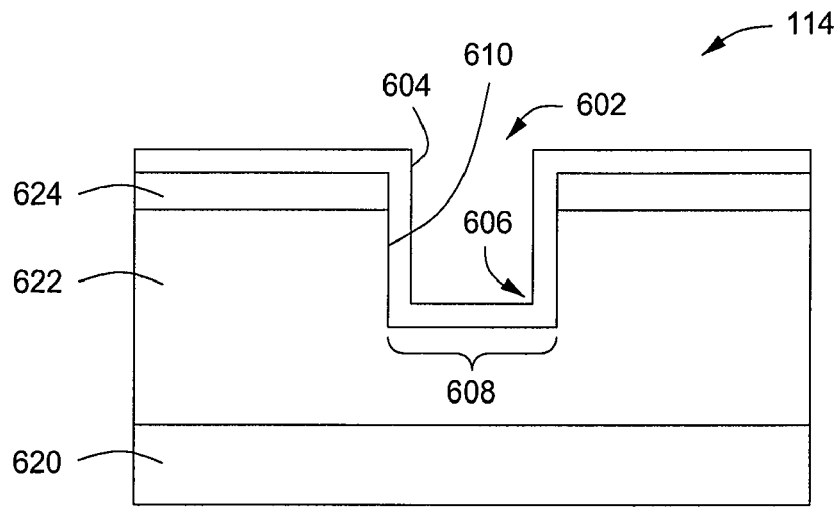
FIG. 6 is a partial schematic, cross-sectional view of a substrate having benefits disclosed by embodiments of the present invention.

Etch methods using dual frequency bias as discussed above have demonstrated a large extension to the process capability and operational window of appropriately configured etch chambers, such as discussed above with respect to FIG. 1. Specifically, several examples of inventive etch processes are discussed in greater detail below with respect to FIG. 6, which shows one illustrative embodiment of the substrate 114 having a substrate layer 620 with a material layer 622 formed thereover and having a patterned mask 624 deposited atop the material layer 622. In some embodiments, the mask 624 may comprise photoresist, amorphous carbon, polysilicon, or the like. The mask 624 may be from about 1,000-3,000 Angstroms thick. Alternatively, the mask 624 may be greater than 3,000 Angstroms thick.

A. Increased Ion Energy Distribution

In one embodiment, an etch process window is advantageously widened by mixing a high frequency (e.g., 13.56 MHz and/or 60 MHz) and a low frequency (e.g., 2 MHz and/or other low frequency) bias RF signal with different mixing ratio in a wide total power range.

For example, certain etch processes, such as oxide ($SiO_2$) etch processes, are a balance between polymer deposition and breakdown. The etch chemistry and process conditions are controlled such that a fluorocarbon ($C_xF_y$) polymer 604 is first deposited to a surface of a feature 602 being etched into the material layer 622. Ions coming from the plasma body and accelerated by the sheath voltage bombard the polymer-covered surface with sufficient energy to break down the polymer 604. The polymer breakdown components provide the etchant for the reaction to etch the feature 602. The broken down polymer components react with the material layer 622 (e.g., oxide ($SiO_2$)) to form volatile by-products (such as $SiF_4$, $CO$, $CO_2$) which subsequently get pumped out of the process chamber.

In this type of process, two conditions typically cause the etch process to stop. First, if too much polymer is deposited, the ion energy may not be sufficient to break down the polymer, thereby stopping the etch process. Second, if too little polymer is deposited, there may not be sufficient etchant formation due to the polymer being completely used up.

Moreover, due to the shrinkage of features formed on semiconductor devices, mask, or photoresist (PR), layers become thinner and thinner to facilitate the formation of the small features. Therefore, a thick layer of polymer typically needs to be deposited on the PR surface to protect it. Thus, etch stop due to excessive polymer deposition can easily occur. Therefore, control of the energy range of the incoming ions is critically important to control how much polymer deposition the process can withstand.

As discussed above with respect to FIG. 3, the ratio of the power of the two bias frequencies can be advantageously utilized to control the ion energy distribution, thereby facilitating the flexibility to use the desired level of polymerization chemistry as required for a given process. For example, the ratio may be selected such that high energy ions generated by increasing the low frequency component of the bias power are able to break through a thicker layer of polymer deposited at the etch-front during the etch process. Thus, a more polymerized chemistry may be utilized in a process, thereby resulting in higher photoresist selectivity.

Figure 7:
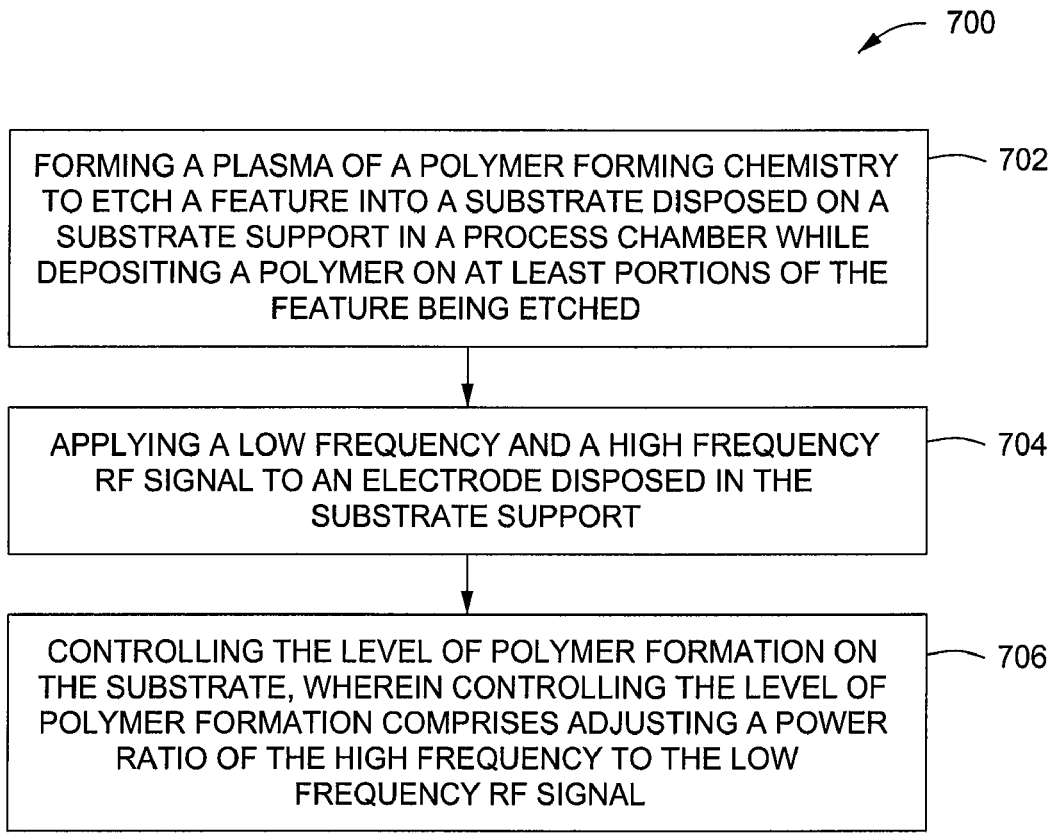
FIG. 7 is a flow diagram of a method of processing a semiconductor substrate in accordance with some embodiments of the invention.

For example, FIG. 7 is a flow diagram of a method (700) of processing a semiconductor substrate in accordance with some embodiments of the invention. In some embodiments that method may include forming a plasma of a polymer forming chemistry to etch a feature into a substrate disposed on a substrate support in a process chamber while depositing a polymer on at least portions of the feature being etched (as shown at 702). Next, a low frequency and a high frequency RF signal may be applied to an electrode disposed in the substrate support (as shown at 704). Next, the level of polymer formation on the substrate may be controlled, wherein controlling the level of polymer formation includes adjusting a power ratio of the high frequency to the low frequency RF signal (as shown at 706).

For example, in an oxide etch process, an etchant gas or gaseous mixture comprising $C_xF_y$ (x, y=1-8), may be provided to the chamber at a rate in the range of about 20 to 200 sccm of $C_xF_y$. In some embodiments, the gaseous mixture may be a highly polymerizing gas mixture comprising $C_xF_y$ (where y/x<2) or $C_xH_yF_z$ (where z/x<2 and y≠0). In some embodiments, $O_2$ may optionally be provided to the chamber. In some embodiments, $O_2$ may be provided at a rate of about 100 sccm. During the process, the substrate temperature may be maintained between about 0 and 110 degrees Celsius at a pressure in the process chamber 100 of between about 10 and 200 mTorr. $C_xF_y/O_2$ ratio may be between about 0.5 to 4. Optionally, an inert dilution gas may be provided, such as argon (Ar).

A plasma may be formed in the chamber be providing a high frequency RF signal and a low frequency RF signal to an electrode in the process chamber (for example as shown in FIG. 1). As used throughout this disclosure, a high frequency signal is one having a frequency greater than or equal to about 13.56 MHz and a low frequency signal is one having a frequency of less than or equal to about 2 MHz. In some embodiments, the high frequency signal may be between 500 and 5000 Watts and between about 13 and 14 MHz, and the low frequency signal may be between 0 and 5000 Watts and between 1.8 and 2.2 MHz. The mixing ratio may generally be any ratio. Moreover, the $C_xF_y/O2$ ratio may vary at different 13.56 MHz to 2 MHz power ratios and vice-versa due to the polymer/ion energy interaction described above. It is contemplated that other high and low frequencies may be utilized in accordance with the teachings provided herein.

Accordingly, a process for etching a layer of material on a substrate utilizing a polymer forming chemistry may be controlled using the teachings disclosed above. In some embodiments, a plasma of a polymer forming chemistry may be provided to etch a feature into a substrate. The level of polymer formation may be monitored during at least a portion of the etch process. Alternatively or in combination, a previous determination of the level of polymer formation for a given process may be utilized to determine a desired level of ion energy to be developed within the plasma proximate the substrate. The power ratio of the high frequency to the low frequency RF signal may then be set to obtain the desired ion energy level as discussed above. Moreover, the process may be monitored and the power ratio controlled during processing to continually provide a dynamic desired ion energy level.

Additionally, in some embodiments, a higher ratio of low frequency power may provide additional advantages during an initial stage of a power on step of the recipe. During power ramping up, the power to gas flow ratio is low, resulting in high polymerization and sometimes etch rate slowing or stopping in large open area regions. The addition of low frequency power and increasing the ratio of low frequency to high frequency power applied may be utilized to advantageously break through the polymer layer, thus reducing the etch rate slow/stop problem.

B. Improved Feature Profile, CD, and Etch Rate

High energy ions generated by the low frequency component of the dual frequency bias power also advantageously provide more vertical and straight profiles for both contact holes and trenches, thereby facilitating a large bottom critical dimension (CD) (shown in FIG. 6 as CD 608), even for smaller feature sizes.

Specifically, although the vertical profile of the feature 602 is facilitated by polymer deposition on a sidewall 612 thereof, the polymer 604 on the sidewall 612 can be charged up during the etch process. The resultant charged sidewall 612 can then bend the ion trajectory because of the electrostatic force, thereby causing shrinkage of the bottom CD 608. The dual frequency bias power advantageously allows for increased ion energy due to the low frequency component and increased plasma density due to the high frequency component. The higher ion energy makes it more difficult to bend the ion trajectory, thereby facilitating a straighter sidewall profile. In addition, vertically traveling ions can reach a bottom corner 606 of the feature 602 being formed (i.e., contact hole or trench), thereby facilitating a larger bottom CD 608 (which is usually preferred due to smaller contact resistance).

This advantage can be extended to other processes in which the etch profile is dependent on incoming ion trajectory, such as where the reactive ions and/or neutrals contact and/or react with materials being etched.

For example, in an amorphous carbon etch process, an etchant gas or gaseous mixture comprising $C_xH_y$ (x, y=0-4) or $N_xH_y$ (x, y=0-3) may be provided to the chamber at a rate in the range of about 50 to 1000 sccm. In some embodiments, $O_2$ or CO may optionally be provided to the chamber. In some embodiments, $O_2$ may be provided at a rate of about 100 sccm. During the process, the substrate temperature may be maintained between about 0 and 110 degrees Celsius at a pressure in the process chamber 100 of between about 10 and 500 mTorr.

In addition, the disadvantage of low frequency bias power by itself it that it is hard to keep a very high plasma density, which adversely affects the etch rate. Therefore, a high power is required to sustain the plasma and even higher power is generally needed to have sufficient plasma density. Mixing the low frequency bias power component with a higher frequency bias power component facilitates maintaining a high plasma density, thereby providing an increased etch rate in addition to the improved sidewall profile.

For example, in an etch process similar as described above, control of the magnitude of the high frequency bias RF signal may advantageously provide an improved sidewall profile. In some embodiments, the high frequency signal may be between 500 and 5000 Watts and between 13 and 14 MHz, and the low frequency signal may be between 0 and 5000 Watts and between 1.8 and 2.2 MHz. The mixing ratio may generally be any ratio. It is contemplated that other high and low frequencies may be utilized in accordance with the teachings provided herein.

Accordingly, in some embodiments, the process as described above may further include monitoring of the sidewall profile of the feature being etched. The ratio of the high and low frequency signals may then be controlled to provide an ion energy level as desired to control the sidewall profile within acceptable ranges. Alternatively, or in combination, a previously measured sidewall profile (or series of profiles) for a given process recipe may be utilized to determine a suitable range of acceptable ion energy levels expected for that process recipe which may then be obtained via the proper ratio between the low and high frequencies applied.

C. Independent Ion Bombardment and Plasma Density Control

In another embodiment the high and low frequency bias powers can by mixed in varying ratios with other power signals coupled to the same or different electrodes, such as an electrode disposed above the substrate support 116, to independently control the ion bombardment of the substrate with a wide tuning range of ion energy (using the dual frequency bias powers) and plasma density (using one or more other signals coupled to other electrodes). Thus, a wide range of applications having different plasma requirements may be performed in a single chamber. For example, high aspect ratio oxide contact etch processes requires both high energy ion physical bombardment and high ion flux as compared to a nitride etch process which involves mostly the chemical etch and requires low physical bombardment (i.e., lower ion energy).

In a process chamber 100 having a capacitively coupled plasma source, the bias power generates a bias voltage due to charge redistribution between the plasma body 110 and the electrode 128. A higher bias power results in a higher the bias voltage. Using an independent plasma source power, such as introduced from a top electrode 128, does not increase the bias voltage. A process requiring a high plasma density does not necessarily require high bias voltage. In some cases, the process may require a lower bias voltage. Thus, by combining the dual frequency bias power with independent plasma source power(s), an independent plasma density control knob is provided. Combined with the advantages discussed above in sections A and B, power control flexibility of the process chamber is greatly improved as compared to single bias powered chambers.

For example, in the exemplary etch process described above, a third RF signal may be provided to the chamber in addition to the dual frequencies. In one embodiment, the third RF signal may be coupled to the same electrode as the low and high frequency bias signals. Alternatively, the third RF signal may be coupled to another electrode, such as the chamber wall, an electrode disposed over the substrate support, an antenna disposed in or above a ceiling of the chamber, or the like. The third RF signal may be up to about 3000 Watts and have a frequency of between about 60 to 200 MHz. The high frequency bias signal may be between 500 and 5000 Watts and between 13 and 14 MHz, and the low frequency bias signal may be between 0 and 5000 Watts and between 1.8 and 2.2 MHz. The mixing ratio may generally be any ratio. It is contemplated that other frequencies may be utilized in accordance with the teachings provided herein.

In some embodiments, a high density plasma may be formed using a first RF signal having a frequency greater than about 60 MHz. A substrate bias voltage may be independently controlled by applying a second and third frequency (having high and low frequencies as described above) to an electrode in a substrate support. In some embodiments, the high and low frequency signals may be controlled as described above while independently controlling the plasma density utilizing the first frequency.

D. Improved Etch Rate Uniformity

Utilization of both high and low frequency RF bias powers also compliments each other for the variation of center to edge etch performance differences. Therefore, the mixing ratio is an additional tuning knob for etch uniformity, as discussed above with respect to FIG. 4.

Due to the different behavior of one RF circuit at different frequencies, the plasma current is grounded at various locations of the chamber interior surface. These variations may vary the etch behavior, e.g., the etch rate at the different region of the substrate, i.e., the center or the edge of the substrate. Therefore, in one embodiment, the etch rate uniformity tuning knob is added to the system and the tuning amount can also be varied by the frequency mixing ratio.

Grounding paths for the frequencies of RF powers on an electrode provided by the opposite electrode component redistribute the electric field in the chamber 100 when the RF power with those frequencies is turned on. The new distribution of the electric field guides the plasma current with certain frequencies, which would otherwise be directed to the chamber wall to look for the RF ground, more vertically towards the opposite electrode, thereby reducing the radial variation of the plasma density and avoiding high plasma density at the substrate edge. Thus center-to-edge etch rate tunability and optimization of the etch rate uniformity is advantageously provided.

E. Independent Tuning of Etch Rate Uniformity and Etch Profile (CD) Uniformity

Often, etch depth, or etch rate uniformity and etch profile (CD) uniformity are competing factors. However, the etch rate uniformity mechanism described above with respect to the grounding path impedance has no effect on etch profile (CD) uniformity. Thus, this mechanism may be used in combination with the ratio of the dual frequency bias components as discussed above for independent control of CD and center-edge etch rate uniformity.

In some embodiments, the ratio between the high and low frequencies may be adjusted during an etch process in order to control the CD uniformity similar to as discussed above with respect to the control of vertical sidewall profiles.

F. Increased Plasma Density

Combination of top RF source power and magnetic field to provide extremely high plasma density, thereby facilitating processes that require high plasma density, such as plasma clean processes to clean the chamber interior. Optical emission spectroscopy (OES) results for magnetic field (B-field) and source power unexpectedly reveals that the combined effect of these two inputs are much greater than their individual effects added together.

G. Increased Plasma Density and Ion Energy Distribution

A magnetic field may be utilized in combination with the processes described above to provide a high plasma density while using the low frequency component of the dual frequency bias to facilitate a plasma with high energy ions. The magnetic field advantageously increases the plasma density without decreasing mask selectivity.

For example, in an etch process similar as described above, a magnetic field may be provided to independently increase plasma density without decreasing mask selectivity. The magnetic field may be uniform or sloped, static or rotated.

H. Increased Plasma Density and Ion Energy Distribution

The combination of two RF bias powers (e.g., 2 MHz and 13.56 MHz) combined with the magnetic field advantageously provides both of the benefits as discussed above in sections A, B, and G, thereby providing more flexible process tuning.

I. Independent Ion Bombardment and Plasma Density Control

The combination of dual frequency bias powers with a high frequency signal applied to either the upper or lower electrodes and the application of a magnetic field to the plasma processing region of the chamber advantageously provides the benefits discussed above in each of sections C, F, and G, thereby providing more flexible process tuning and high plasma density.

J. Improved Bias Voltage Uniformity

The bias voltage can be harmful if it is not uniform across the substrate by inducing crosstalk between adjacent devices, thereby causing device damage. The ratio of two RF bias powers may be used to control the DC voltage (Vdc) distribution across the substrate. Instantaneous non-uniformity of the plasma density can form lateral difference of the electro potention to form a closed loop using part of the device structure on the substrate, which may induce current higher than the device is designed to handle. The control of the plasma density uniformity described in sections D, E and G will therefore improve the Vdc uniformity thus reducing the incidence of plasma damage to the device. Thus, uniform Vdc obtained from tuning the mixing ratio can optimize the charge-up uniformity over the substrate, thereby reducing the chance of damage to the substrate due to charge-up.

K. Optimized Bias Voltage Value

In many etch processes, the bias voltage plays an important role. Higher bias voltage may be needed to increase the etch rate and etch stop margin while lower bias voltage may be preferred in some cases (such as when small corner facet and shoulder loss and less stop layer loss is required). While the low frequency bias power increases the ion energy distribution range at the high end to get the advantages described above, ability to select any high/low frequency power ratio allows the reactor to provide any optimized bias voltage value for a wide range of etch processes having different requirements.

Thus, various methods and apparatus for controlling characteristics of a plasma in a plasma enhanced processing chamber using a dual frequency cathode drive has been provided. The mixing of the two frequencies driving the cathode controls the ion energy and power distributions of a plasma.

While the foregoing is directed to the illustrative embodiment of the present invention, other and further embodiments of the invention may be devised without departing from the basic scope thereof, and the scope thereof is determined by the claims that follow.

What is claimed is:

1. A method of processing a substrate, comprising:
    forming a plasma of a polymer forming chemistry to etch a feature into a substrate disposed on a substrate support in a process chamber while depositing a polymer on at least portions of the feature being etched;
    applying a low frequency and a high frequency RF signal to an electrode disposed in the substrate support; and
    controlling the level of polymer formation on the substrate to a desired level while etching the feature with the plasma, wherein controlling the level of polymer formation comprises adjusting a power ratio of the high frequency to the low frequency RF signal.

2. The method of claim 1, further comprising:
    monitoring a level of polymer formation during at least a portion of the etch process; and
    wherein controlling the level of polymer formation further comprises controlling the level of polymer formation in response to the monitoring.

3. The method of claim 1, further comprising:
    predetermining a level of polymer formation for a particular process; and
    adjusting a power ratio of the high frequency to the low frequency RF signal in response to the predetermined polymer formation level.

4. The method of claim 1, wherein the high frequency RF signal has a frequency between about 13 to about 14 MHz and the low frequency RF signal has a frequency between about 1.8 to about 2.2 MHz.

5. The method of claim 1, wherein the polymer forming chemistry comprises a fluorocarbon gas.

6. The method of claim 5, wherein the polymer forming chemistry comprises a fluorocarbon gas mixed with oxygen ($O_2$).

7. The method of claim 1, wherein the feature is etched into a silicon oxide ($SiO_2$) layer disposed on the substrate and having a patterned mask layer formed thereover.

8. The method of claim 1, further comprising:
    monitoring a sidewall profile of the feature being etched; and
    controlling the ratio of the high and low frequency RF signals to control the sidewall profile in response to the monitored sidewall profile.

9. The method of claim 1, further comprising:
    predetermining one or more acceptable sidewall profiles for a particular process recipe; and
    controlling the ratio of the high and low frequency RF signals to control the sidewall profile in response to the predetermined one or more sidewall profiles.

10. The method of claim 1, further comprising:
    providing a first power ratio of the high frequency to the low frequency RF signal during a first portion of a process to etch the feature into the substrate with the plasma; and
    providing a second power ratio of the high frequency to the low frequency RF signal during a second portion of the process to etch the feature into the substrate with the plasma, the second power ratio different than the first.

11. The method of claim 10, wherein the first portion of the process is a power ramp up period.

12. The method of claim 1, further comprising:
    providing a third RF signal to the plasma.

13. The method of claim 12, wherein the third RF signal has a frequency that is greater than or equal to about 60 MHz.

14. The method of claim 12, wherein the third RF signal is coupled to an overhead electrode disposed opposite the substrate support.

15. The method of claim 12, further comprising:
    providing a magnetic field within the chamber to control a density of the plasma.

16. The method of claim 1, further comprising:
    providing a magnetic field within the chamber to control a density of the plasma.

17. The method of claim 1, wherein a layer being etched on the substrate comprises amorphous carbon, and wherein the polymer forming chemistry comprises at least one of $C_xH_y$ (where x, y=0-4) or $N_xH_y$ (where x, y=0-3).

18. A method of processing a substrate, comprising:
    forming a plasma in a process chamber by coupling RF power at a first frequency to a polymer forming process gas disposed in the process chamber;
    applying RF power to an electrode disposed in the process chamber at a second frequency and a third frequency; and
    controlling a level of polymer formation on a substrate being etched in the process chamber to a desired level while etching the substrate with the plasma, wherein controlling the level of polymer formation comprises adjusting a power ratio of the second frequency to the third frequency.

19. The method of claim 18, wherein the second frequency is between about 13 to about 14 MHz and the third frequency is between about 1.8 to about 2.2 MHz.

20. The method of claim 19, wherein the first frequency is greater than or equal to about 60 MHz.

* * * * *